(12) United States Patent
Zhang et al.

(10) Patent No.: US 8,274,811 B2
(45) Date of Patent: Sep. 25, 2012

(54) ASSISTING FGL OSCILLATIONS WITH PERPENDICULAR ANISOTROPY FOR MAMR

(75) Inventors: Kunliang Zhang, Fremont, CA (US); Min Li, Dublin, CA (US); Yuchen Zhou, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 26 days.

(21) Appl. No.: 12/927,699

(22) Filed: Nov. 22, 2010

(65) Prior Publication Data

US 2012/0126905 A1    May 24, 2012

(51) Int. Cl.
*G11B 5/127* (2006.01)
*G11C 11/15* (2006.01)
*G11C 11/16* (2006.01)
*H01L 43/12* (2006.01)

(52) U.S. Cl. ........ 365/145; 365/158; 365/171; 360/110; 360/125.31; 360/324.2; 428/810; 428/811; 428/811.1; 428/811.2; 428/811.3; 428/811.5; 428/815; 428/816; 427/127; 29/603.08

(58) Field of Classification Search ................ None
See application file for complete search history.

(56) References Cited

U.S. PATENT DOCUMENTS

| | | | |
|---|---|---|---|
| 7,128,987 B2 | 10/2006 | van de Veerdonk et al. | |
| 7,561,383 B2* | 7/2009 | Kamiguchi et al. | 360/324 |
| 7,602,591 B2 | 10/2009 | Sbiaa et al. | |
| 7,821,088 B2 | 10/2010 | Nguyen et al. | |
| 7,936,598 B2* | 5/2011 | Zheng et al. | 365/173 |
| 2009/0180308 A1* | 7/2009 | Inomata et al. | 365/145 |
| 2009/0257151 A1* | 10/2009 | Zhang et al. | 360/324.2 |
| 2010/0039181 A1 | 2/2010 | Firastrau et al. | |
| 2010/0142088 A1* | 6/2010 | Iwasaki et al. | 360/110 |
| 2010/0177448 A1* | 7/2010 | Kaka | 360/324.2 |
| 2011/0096443 A1* | 4/2011 | Zhang et al. | 360/324.2 |
| 2011/0134561 A1* | 6/2011 | Smith et al. | 360/59 |
| 2011/0279921 A1* | 11/2011 | Zhang et al. | 360/59 |
| 2011/0293967 A1* | 12/2011 | Zhang et al. | 428/827 |
| 2012/0113540 A1* | 5/2012 | Zhang et al. | 360/59 |

OTHER PUBLICATIONS

"Microwave Assisted Magnetic Recording," by Jian-Gang Zhu, IEEE Transactions on Magnetics, vol. 44, No. 1, Jan. 2008, pp. 125-131.

"Current driven excitation of magnetic multilayers," by J.C. Slonczewski, Journal of Magnetism and Magnetic Materials 159 (1996) L1-L7, 1996 Elsevier Science B.V.

(Continued)

*Primary Examiner* — Kevin Bernatz
(74) *Attorney, Agent, or Firm* — Saile Ackerman LLC; Stephen B. Ackerman

(57) ABSTRACT

A spin transfer oscillator (STO) structure is disclosed that includes two assist layers with perpendicular magnetic anisotropy (PMA) to enable a field generation layer (FGL) to achieve an oscillation state at lower current density for MAMR applications. In one embodiment, the STO is formed between a main pole and write shield and the FGL has a synthetic anti-ferromagnetic structure. The STO configuration may be represented by seed layer/spin injection layer (SIL)/spacer/PMA layer 1/FGL/spacer/PMA layer 2/capping layer. The spacer may be Cu for giant magnetoresistive (GMR) devices or a metal oxide for tunneling magnetoresistive (TMR) devices. Alternatively, the FGL is a single ferromagnetic layer and the second PMA assist layer has a synthetic structure including two PMA layers with magnetic moment in opposite directions in a seed layer/SIL/spacer/PMA assist 1/FGL/spacer/PMA assist 2/capping layer configuration. SIL and PMA assist layers are laminates of (CoFe/Ni)x or the like.

29 Claims, 4 Drawing Sheets

OTHER PUBLICATIONS

"Current-induced magnetization reversal in nanopillars with perpendicular anisotropy," by S. Mangin et al., 2006 Nature Publishing Group, nature materials, vol. 5, Mar. 2006, pp. 210-215, www.nature.com/naturematerials.

Co-pending U.S. Appl. No. 12/589,614, filed Oct. 26, 2009, "MTJ Incorporating CoFe/Ni Multilayer Film with Perpendicular Magnetic Anisotropy for MRAM Application," assigned to the same assignee as the present invention, 42 pgs.

Co-pending U.S. Appl. No. 12/802,091, filed May 28, 2010, "A Multilayer Structure with High Perpendicular Anisotropy for Device Applications," assigned to the same assignee as the current invention, 41 pgs.

Co-pending U.S. Appl. No. 12/927,083, filed Nov. 5, 2010, "Modified Field Generation Layer for Microwave Assisted Magnetic Recording," assigned to the same assignee as the present invention, 25 pgs.

* cited by examiner

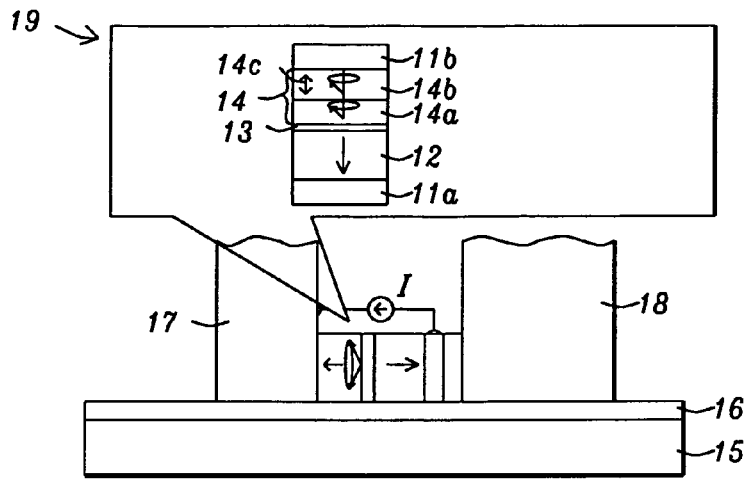
FIG. 1 - Prior Art
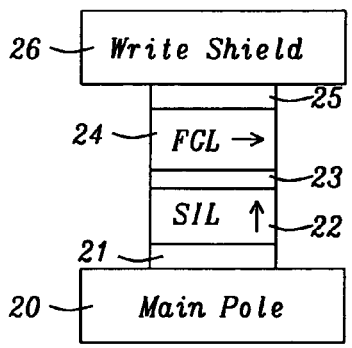
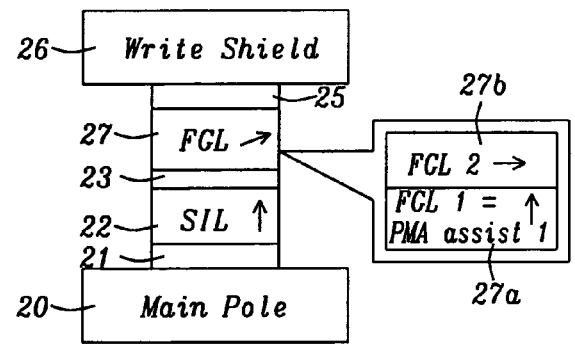
FIG. 2a          FIG. 2a'
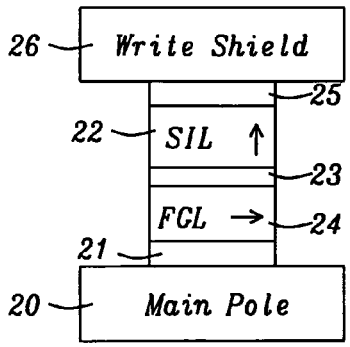
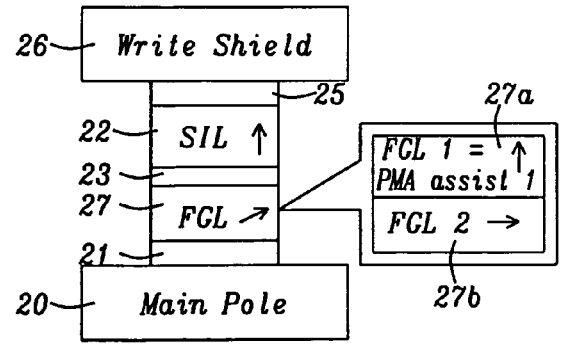
FIG. 2b          FIG. 2b'

ASSISTING FGL OSCILLATIONS WITH PERPENDICULAR ANISOTROPY FOR MAMR

RELATED PATENT APPLICATIONS

This application is related to the following: U.S. Patent Application 2009/0257151; Ser. No. 12/456,935, filing date Jun. 24, 2009; Ser. No. 12/589,614, filing date Oct. 26, 2009; Ser. No. 12/802,091, filing date May 28, 2010; and Ser. No. 12/927,083, filing date Nov. 5, 2010; assigned to the same assignee and herein incorporated by reference in their entirety.

FIELD OF THE INVENTION

The invention relates to a multilayer magnetic stack including a seed layer and at least two $(CoFe/Ni)_x$ laminated layers with high perpendicular magnetic anisotropy (PMA) to improve oscillations within an adjacent field generation layer (FGL), and in particular, to increasing the magnetic saturation×thickness (Mst) value in the FGL to provide a large enough field to assist writing in microwave assisted magnetic recording (MAMR) applications.

BACKGROUND OF THE INVENTION

Magnetoresistive Random Access Memory (MRAM), based on the integration of silicon CMOS with MTJ technology, is a major emerging technology that is highly competitive with existing semiconductor memories such as SRAM, DRAM, and Flash. Similarly, spin-transfer (spin torque or STT) magnetization switching described by C. Slonczewski in "Current driven excitation of magnetic multilayers", J. Magn. Magn. Mater. V 159, L1-L7 (1996), has stimulated considerable interest due to its potential application for spintronic devices such as STT-MRAM on a gigabit scale. Recently, J-G. Zhu et al. described another spintronic device called a spin transfer oscillator in "Microwave Assisted Magnetic Recording", IEEE Trans. on Magnetics, Vol. 44, No. 1, pp. 125-131 (2008) where a spin transfer momentum effect is relied upon to enable recording at a head field significantly below the medium coercivity in a perpendicular recording geometry.

Materials with PMA are of particular importance for magnetic and magnetic-optic recording applications. Spintronic devices with perpendicular magnetic anisotropy have an advantage over MRAM devices based on in-plane anisotropy in that they can satisfy the thermal stability requirement and have a low switching current density but also have no limit of cell aspect ratio. As a result, spin valve structures based on PMA are capable of scaling for higher packing density which is one of the key challenges for future MRAM applications and other spintronic devices. Theoretical expressions predict that perpendicular magnetic devices have the potential to achieve a switching current lower than that of in-plane magnetic devices with the same magnetic anisotropy field according to S. Mangin et al. in Nat. Mater. 5, 210 (2006).

When the size of a memory cell is reduced, much larger magnetic anisotropy is required because the thermal stability factor is proportional to the volume of the memory cell. Generally, PMA materials have magnetic anisotropy larger than that of conventional in-plane soft magnetic materials such as NiFe or CoFeB. Thus, magnetic devices with PMA are advantageous for achieving a low switching current and high thermal stability.

PMA materials have been considered for microwave assisted magnetic recording (MAMR) as described by J-G. Zhu et al. in "Microwave Assisted Magnetic Recording", IEEE Trans. on Magn., Vol. 44, No. 1, pp. 125-131 (2008). A mechanism is proposed for recording at a head field significantly below the medium coercivity in a perpendicular recording geometry. FIG. 1 is taken from the aforementioned reference and shows an ac field assisted perpendicular head design. The upper caption 19 represents a perpendicular spin transfer driven oscillator (STO) for generating a localized ac field in a microwave frequency regime and includes a bottom electrode 11a, top electrode 11b, perpendicular magnetized reference layer 12 (spin injection layer or SIL), metallic spacer 13, and oscillating stack 14. Oscillator stack 14 is made of a field generation layer 14a and a layer with perpendicular anisotropy 14b having an easy axis 14c. The ac field generator in the upper caption 19 is rotated 90 degrees with respect to the lower part of the drawing where the device is positioned between a write pole 17 and a trailing shield 18. The writer moves across the surface of a magnetic media 16 that has a soft underlayer 15. The reference layer 12 provides for spin polarization of injected current (I). Layers 14a, 14b are ferromagnetically exchange coupled. Improved materials for the reference layer and oscillator stack are needed as this technology matures.

U.S. Pat. No. 7,128,987 describes a perpendicular magnetic medium with each laminated layer consisting of a composite wherein a discontinuous magnetic phase is surrounded by a non-magnetic phase. Fabrication methods may involve a heat treatment or an unspecified surface treatment of the composite layer.

Further improvement in MAMR technology is needed to generate stronger FGL oscillations that will enable a current density below the level of $1 \times 10^8$ A/cm$^2$ used in current devices and thereby improve performance in terms of power usage and reliability.

SUMMARY OF THE INVENTION

One objective of the present invention is to provide a spin transfer oscillator (STO) structure for MAMR applications that enables stronger FGL oscillations under a lower current density and lower bias voltage than in current MAMR schemes.

A second objective of the present invention is to provide a STO structure in which a FGL having greater Mst than previously employed is able to be excited to an oscillation state to provide a flux (ac field) significantly greater than 300-600 Oe realized in current devices.

These objectives are achieved according to the present invention by a STO structure comprised of a seed layer, SIL, FGL, capping layer, and two PMA assist layers wherein one PMA assist layer is adjacent to a bottom FGL surface and a second PMA assist layer is adjacent to a top FGL surface. In all embodiments, there is a spacer material sandwiched between the SIL and the first PMA assist layer. The spacer may be Cu in a current perpendicular to plane (CPP) giant magnetoresistive (GMR) configuration or one of MgO, AlOx, TiOx, ZnO in a tunneling magnetoresistive (TMR) configuration.

According to one embodiment representing a bottom STO scheme, the FGL has a synthetic anti-ferromagnetic (SyAF) configuration in which two ferromagnetic layers such as FeCo having opposite in-plane magnetization directions are separated by a coupling layer. The STO stack has a configuration represented by seed layer/SIL/first spacer/first PMA assist layer/FGL/second spacer/second PMA assist layer/ capping layer. The PMA assist layers and SIL are preferably (CoFe/Ni)x laminates or the like where x ranges from 5 to 50 for the SIL, 5-30 for the first PMA assist layer, and 7 to 10 for the second PMA assist layer. The two PMA assist layers are believed to have a similar assist effect on the FGL which means they are equally able to partially tilt the in-plane FGL magnetization to include a perpendicular component. In this case, the lower FeCo layer in the FGL is preferably thicker than the upper FeCo layer. Since the first PMA assist layer is strongly magnetically coupled to the adjoining lower FeCo layer in the FGL, the anisotropy of the FGL is forced to tilt partially toward a perpendicular to plane direction so that the entire SyAF FGL structure easily oscillates under a low current density.

In a second embodiment that is a top STO scheme where the SIL adjoins the uppermost capping layer in the STO stack, the FGL has a SyAF structure and the STO has a configuration represented by seed layer/second PMA assist layer/second spacer/FGL/first PMA assist layer/first spacer/SIL/capping layer. Preferably, the lower FeCo layer in the FGL is thinner than the upper FeCo layer. Again, the first PMA assist layer is strongly coupled to the thicker FeCo layer in the FGL and thereby tilts the magnetization of the FGL toward a perpendicular to plane direction.

In a third embodiment, a bottom STO structure has a FGL comprised of only a single ferromagnetic layer such as FeCo with an in-plane magnetization direction. However, the second PMA assist layer has a so-called synthetic structure wherein two CoFe/Ni laminates or the like having perpendicular magnetization in opposite directions are separated by a coupling layer. A lower (CoFe/Ni)q laminate is separated from the FGL by a second spacer while an upper (CoFe/Ni)p laminate contacts a capping layer in a seed layer/SIL/first spacer/first PMA assist layer/FGL/second spacer/second PMA assist layer/capping layer configuration where p and q are lamination numbers and p>q. Typically, p is an integer between 7 and 10 and q is an integer from 3 to 6. The Fe composition in the $[(Co_{100-y}Fe_y)/Ni]x$ laminated SIL may vary from y=0 (pure Co case) to y=90. The first spacer may be Cu for a CPP-GMR configuration or a metal oxide in a TMR scheme, and the second spacer is preferably Cu. Alternatively, the upper (CoFe/Ni)p laminate may be replaced by other high Hk, low Ms PMA materials such as (Co/Pt) laminates or (Co/Pd) laminates. In this embodiment, the first PMA assist layer and (CoFe/Ni)q portion of the second PMA assist layer both assist the FGL to achieve a magnetization with a partial PMA character while the upper (CoFe/Ni)p laminate is only used to assure alignment of the (CoFe/Ni)q laminate.

A fourth embodiment retains the same layers as in the third embodiment except the structure has a top STO configuration represented by seed layer/second PMA assist layer/second spacer/FGL/first PMA assist layer/first spacer/SIL/capping layer. In this case, the (CoFe/Ni)p portion of the synthetic second PMA assist layer adjoins the seed layer, and the (CoFe/Ni)q portion is separated from the FGL by the second spacer. The first PMA assist layer and (CoFe/Ni)q portion of the second PMA assist layer both influence the FLG to achieve a partial PMA character while the lower (CoFe/Ni)p laminate is only used to assure alignment of the (CoFe/Ni)q laminate.

BRIEF DESCRIPTION OF THE DRAWINGS

FIG. 1 is a schematic illustration of a MAMR recording head with an ac field assisted perpendicular head design according to a prior art reference.

FIGS. 2a, 2b are cross-sectional views of conventional STO structures having a bottom SIL and top SIL, respectively, which are separated from a FGL by a spacer.

FIGS. 2a', 2b' are cross-sectional views of improved STO structures where the multi-layer stacks in FIGS. 2a, 2b are modified by inserting a PMA assist layer between the FGL and spacer.

DETAILED DESCRIPTION OF THE INVENTION

Figure 3A:
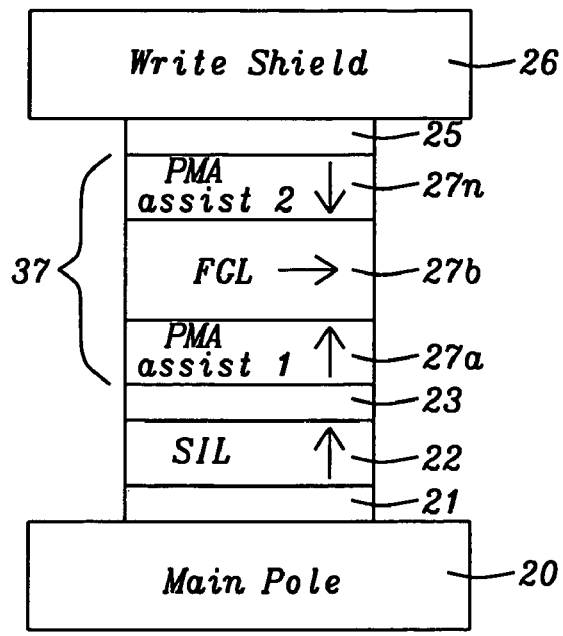
FIGS. 3a, 3b are cross-sectional views of ideal MAMR STO structures in which a FGL has a PMA assist layer adjoining each of its top and bottom surfaces and wherein the PMA assist layers have opposite magnetization directions.

The present invention is a spin transfer oscillator (STO) wherein a laminated layer having high perpendicular magnetic anisotropy (PMA) is positioned on top and bottom surfaces of a field generation layer (FGL) to tilt the in-plane FGL magnetization direction to include a perpendicular to plane component thereby enabling stronger FGL oscillations at lower bias voltage values. Although the laminates in the exemplary embodiments are comprised of Co/Ni or CoFe/Ni layers, those skilled in the art will appreciate that other laminates made of Co/NiFe or CoFe/NiFe multilayer stacks may also be employed as PMA layers in STO structures formed in MAMR, MRAM, sensors, and other magnetic devices. The "x" lamination number in a (CoFe/Ni)x stack, for example, refers to the number of (CoFe/Ni) layers. Other letters besides x may be used to designate a lamination number. The terms magnetization and magnetic moment may be used interchangeably. It should be understood that FeCo designates an iron rich alloy and CoFe generally means a Co rich alloy.

In related U.S. Patent Application 2009/0257151, we disclosed the advantages of Co/Ni multilayer structures having PMA in MRAM applications in which the magnetic anisotropy of a $(Co/Ni)_x$ laminated structure where x=5 to 50 arises from the spin-orbit interactions of the 3d and 4s electrons of Co and Ni atoms. Such interaction causes the existence of an orbital moment which is anisotropic with respect to the crystal axes which are in (111) alignment, and also leads to an alignment of the spin moment with the orbital moment. Similar PMA behavior was described for $(Co_zFe_{(100-z)}/Ni)_x$ and related laminated structures in patent application Ser. No. 12/589614. PMA is improved by using a composite seed layer with a Ta/M1/M2 or Ta/M1 configuration where M1 is a metal or alloy having a fcc(111) or (hcp) hexagonal closed packed (001) crystal orientation such as Ru, Ti, Zr, Hf, NiCr, NiFeCr or the like, and M2 is Cu, Ti, Pd, W, Rh, Au, or Ag where M2 is unequal to M1. The Ta, M1, and M2 layers in the composite seed layer are critical for enhancing the (111) texture in overlying layers. In particular, Ta/Ti/Cu and Ta/Ru/Cu seed layers were found to be especially effective in enhancing PMA and Hc in overlying multilayer stacks. For a Ta/Ru/Cu seed layer, Ta thickness is preferably from 5 to 50 Angstroms, Ru thickness is between 5 and 100 Angstroms, and Cu thickness is from 1 to 100 Angstroms. In an embodiment where M1=Ru, Cu may be omitted to give a Ta/Ru seed layer configuration wherein Ta thickness is 5 to 50 Angstroms and Ru thickness is between 20 and 100 Angstroms. Alternatively, Ta/Ru/Cu may be replaced by Ta/Cu or Ta/NiCr wherein Ta has a 5 to 50 Angstrom thickness, Cu thickness is 20 to 50 Angstroms, and NiCr thickness is 40 to 100 Angstroms.

Multilayer stacks comprised of $(Co/Ni)_x$ or $(Co_zFe_{(100-z)}/Ni)_x$ laminates, or the like have superior properties over conventionally used (Co/Pt) and (Co/Pd) laminates such as higher spin polarization, lower cost of ownership, and higher Mst for certain applications. Furthermore, the Hc component of the laminated layers may be increased by one or more surface modification techniques to improve interfaces between adjoining layers as described in related patent application Ser. No. 12/802091.

In related patent application HT10-007, we disclosed the use of a single PMA assist layer adjoining a FGL to improve FGL oscillations to a FMR frequency higher than 30 GHz. In a bottom STO, the PMA assist layer is grown underneath the FGL while in a top STO the PMA assist layer is formed on a top surface of the FGL. For example, a bottom STO having a structure represented by seed layer/SIL/spacer/PMA assist layer/FGL/capping layer (FIG. 2a') has significantly improved properties in terms of oscillation frequency than a conventional STO structure without a PMA assist layer represented by seed layer/SIL/spacer/FGL/capping layer (FIG. 2a). Seed layer 21, SIL 22, Cu spacer 23, FGL 24, and capping layer 25 are sequentially formed on a main pole 20 in a bottom SIL configuration in FIG. 2a that has a write shield 26 contacting a top surface of the capping layer. The caption adjacent to the right side of FIG. 2a' indicates the PMA assist layer 27a may be formed between the bottom surface of FGL 27b (in-plane magnetization) and a spacer 23 that separates FGL 27 from SIL 22. Thus, FGL 27 is comprised of a PMA assist layer 27a and FGL 27b wherein the former exerts an assist effect on the latter to result in a partially tilted FGL 27 magnetization that includes a perpendicular to plane component thereby enabling FGL oscillations at a lower current density.

Similarly, the top SIL configuration in FIG. 2b' has improved properties compared with the conventional top SIL structure in FIG. 2b. Note that all layers are retained from the bottom SIL structures and only the stacking order is changed. FIG. 2b illustrates a stack with the seed layer 21, FGL 24, spacer 23, SIL 22, and capping layer 25 sequentially formed on the main pole 20. In FIG. 2b', FGL 24 is replaced by a composite FGL 27 having a lower FGL 27b with in-plane magnetization and an upper PMA assist layer 27a grown on a top surface of the lower FGL. In the STO stacks used to generate comparison data, seed layer 21 is Ta/Ru/Cu, SIL 22 is $[FeCo2/Ni6]_{15}$, FGL 24 and FGL 27b are FeCo, capping layer 25 is Ru/Ta/Ru, and PMA assist layer 27a is $[FeCo2/Ni6]_{10}$ in which each laminated FeCo layer has a 2 Angstrom thickness and each Ni layer has a 6 Angstrom thickness. The lamination number is 15 in SIL 22 and 10 in PMA assist layer 27a.

To further improve FGL oscillation in an ideal case, it would be desirable to have two PMA assist layers with one grown underneath the FGL and one grown on a top surface of the FGL. As shown in FIG. 3a, the ideal bottom SIL (bottom STO) structure has a seed layer/SIL/spacer/first PMA assist layer/FGL/second PMA assist layer/capping layer configuration wherein first and second PMA assist layers 27a, 27n have magnetization directions opposite each other and each contact a surface of FGL 27b. In other words, a condition where PMA assist layer 27a has a positive Hk contribution, and PMA assist layer 27n has a negative Hk contribution would have the largest assist effect on FGL 27b oscillation. However, a negative Hk layer is very difficult to grow and therefore a composite FGL 37 is not feasible with current technology. Likewise, the composite FGL 38 in a top SIL structure (FIG. 3b) is not practical because the PMA assist layer 27n cannot be made with current methods. Therefore, an alternative approach that takes advantage of available materials and practical deposition methods is needed to realize an additional assist effect resulting from two PMA layers acting on the FGL.

Figure 3B:
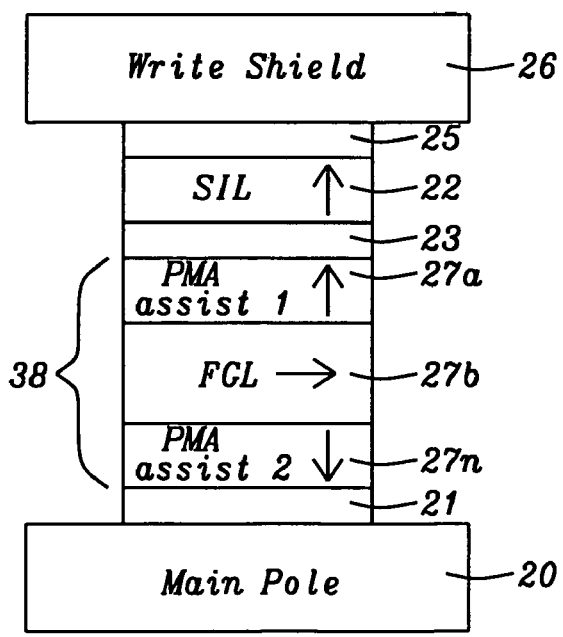

Here we disclose additional discoveries based on modifications of the STO structures presented in FIGS. 3a, 3b that provide an advantage of stronger FGL oscillations with a similar current density used in the prior art. In other words, FGL oscillation at a certain frequency is achieved at a lower current density than in prior art STO schemes by including a second PMA assist layer such that there is a PMA assist layer adjacent to both top and bottom surfaces of the FGL. Various embodiments where two PMA assist layers are configured in a STO structure to achieve improved performance will now be described.

Figure 4:
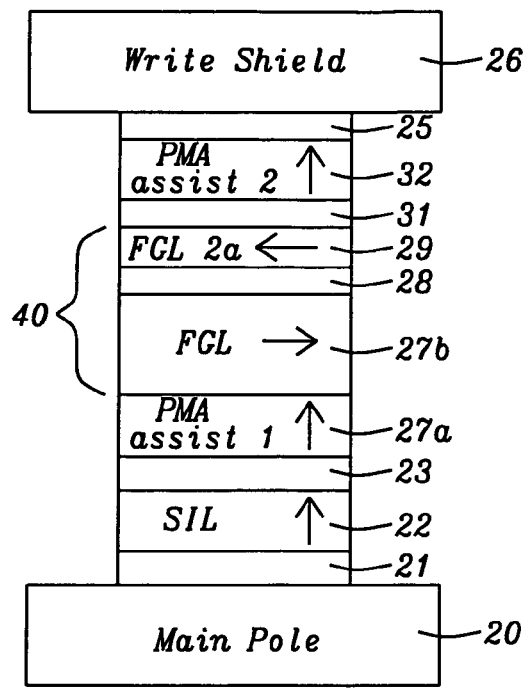
FIG. 4 is a cross-sectional view of a bottom STO structure having a first PMA assist layer adjoining a bottom surface of a synthetic FGL, and a stack comprised of a spacer and a second PMA assist layer formed on a top surface of the synthetic FGL according to a first embodiment of the present invention.

Referring to FIG. 4, a first embodiment of the present invention is depicted and relates to a bottom STO (SIL on bottom) structure wherein the FGL is a synthetic anti-ferromagnetic (SyAF) configuration in which two ferromagnetic layers such as FeCo or the like have magnetizations in opposite directions and are separated by a coupling layer that may be Ru, Ir, or Rh. In the exemplary embodiment, a seed layer 21, SIL 22, first spacer 23, first PMA assist layer 27a, composite FGL 30, second spacer 31, second PMA assist layer 32, and capping layer 25 are sequentially formed on a main pole 20. There is a write shield 26 that is preferably a trailing shield formed on the capping layer. Preferably, the seed layer 21 has a Ta/Ru/Cu or Ta/Ti/Cu configuration although other materials described in related patent application Ser. No. 12/589614 are acceptable. In one aspect, the lower Ta layer contacting the substrate has a thickness from 5 to 50 Angstroms, and preferably 10 Angstroms, the Ti layer has a thickness from 5 to 50 Angstroms, and preferably 30 Angstroms, and the Cu layer has a thickness between 1 and 100 Angstroms, and preferably 20 to 30 Angstroms. All STO layers may be formed in an Anelva sputter deposition tool or the like.

As described in related patent application Ser. No. 12/802091, one or more processes including a plasma treatment (PT) and a natural oxidation (NOX) may be performed on the seed layer prior to deposition of the SIL 22 in order to form a smoother top surface of seed layer 21. As a result, an improved interface will be formed with a subsequently deposited (Co/Ni) or (CoFe/Ni) layer in the SIL 22 and this condition leads to higher perpendicular magnetic anisotropy in the SIL.

The reference (SIL) 22 is preferably a layer with PMA and having a $(Co/Ni)_n$ or $(Co_{(100-z)}Fe_z/Ni)_n$ laminated structure where z is from 0 to 90 and n is between 5 and 50, and more preferably, between 10 and 30. Each of the plurality of Co or CoFe layers in the laminated SIL 22 has a thickness (t1) from 0.5 to 5 Angstroms, and preferably between 1.5 to 3 Angstroms. Each of the plurality of Ni layers in the laminated reference layer has a thickness (t2) from 2 to 10 Angstroms, and preferably between 3.5 and 8 Angstroms. Preferably, the thickness t2 of a Ni layer is greater than a Co or CoFe layer thickness t1, and more preferably, t2~2X t1 in order to optimize the spin orbit interactions between adjacent Co and Ni layers, or between CoFe and Ni layers. In one aspect, when t1 is less than or equal to about 2 Angstroms, the Co or CoFe layer may be considered as a "close-packed" layer and not necessarily having a (111) crystal orientation.

The present invention also encompasses an embodiment wherein the laminated SIL 22 has a composition represented by $[Co(t1)/NiFe(t2)]_n$, $[Co(t1)/NiCo(t2)]_n$, $[CoFe(t1)/NiFe(t2)]_n$, or $[CoFe(t1)/NiCo(t2)]_n$ where the Co and Fe content in the NiCo and NiFe layers, respectively, is from 0 to 50 atomic% and n is from 5 to 30. Alternatively, the laminated SIL 22 may be comprised of $(CoFeR/Ni)_n$, where R is a metal such as Ru, Rh, Pd, Ti, Zr, Hf, Ni, Cr, Mg, Mn, or Cu, the R content in the CoFeR alloy is less than 10 atomic%, and the CoFeR layer has a t1 thickness. In yet another embodiment, the SIL may be comprised of [CoFe(t1)/Pt(t2)]n, [CoFe(t1)/Pd(t2)]n, [CoFe(t1)/Ir(t2)]n, or other PMA materials such as CoPt, FePt, CoPd, FePd, TbFe(Co), and the like.

It is important that each layer in a laminated SIL or laminated PMA assist layer of the present invention be deposited with a low power, high pressure sputter deposition method to preserve the interfaces between Co and Ni layers or between CoFe and Ni layers, for example. We have found that increasing the inert gas pressure to substantially greater than 100 sccm has an important role in yielding a significant enhancement of Hc. Thus, an ultra high Ar pressure of between 100 and 500 sccm during the deposition of $(Co/Ni)_x$, $(Co_{(100-z)}Fe_z/Ni)_x$, or other laminates as noted above causes Hc to be increased up to 30% or more.

Moreover, the NOX treatment described previously may be employed to improve the surface of one or more of the (Co/Ni) or (CoFe/Ni) layers in a PMA multilayer stack. Therefore, the OSL formed by a NOX process improves the interface not only between a composite seed layer and a (Co/Ni) or (CoFe/Ni) layer, but also between adjacent (Co/Ni) layers or between adjacent (CoFe/Ni) layers in a PMA multilayer stack.

There is a non-magnetic spacer 23 formed on the SIL 22. The spacer may be comprised of Cu or another high conductivity metal or metal alloy in a CPP-GMR embodiment having a thickness from 5 to 30 Angstroms. The present invention also anticipates a GMR embodiment having a spacer 23 with a current confining path (CCP) structure in which a dielectric layer with metal pathways therein is sandwiched between two metal layers (i.e. Cu) as appreciated by those skilled in the art. Alternatively, the spacer 23 may be comprised of a dielectric material such as MgO, AlOx, TiOx, ZnO, or other metal oxides or metal nitrides in a TMR configuration.

A first PMA assist layer 27a is formed on the spacer 23 and has a laminated structure that is one of the laminated compositions previously described and represented by (Co/Ni)m, (CoFe/Ni)m, (Co/NiFe)m, (CoFe/NiCo)m, (Co/NiCo)m, or (CoFe/NiFe)m where m is from about 5 to 30, and preferably between 5 and 20. Above the first PMA assist layer is a composite FGL 40 comprised of a lower FGL 27b having a thickness between 100 and 200 Angstroms, a middle coupling layer 28, and an upper FGL 29 with a thickness less than 50 Angstroms. In one aspect, the coupling layer 28 is Ru with a thickness from about 7 to 8 Angstroms. Preferably, FGL 27b, 29 are made of FeCo. However, other materials having a high Mst value may be employed such as alloys of FeCo.

There is a second spacer 31 preferably made of Cu formed on the top surface of composite FGL 40. Above the second spacer is a second PMA assist layer 32 having a laminated structure that is selected from one of the compositions previously described for first PMA assist layer 27a except the lamination number is changed from m to p. For example, first PMA assist layer 27a may be (CoFe/Ni)m and second PMA assist layer 32 may be (CoFe/Ni)p where p is a lamination number between 7 and 10. Alternatively, second PMA assist layer 32 may be one of (Co/Ni)p, (Co/NiFe)p, (Co/NiCo)p, (CoFe/NiFe)p, or (CoFe/NiCo)p. PMA assist layers 27a, 32 are believed to have an assist effect on composite FGL 40 whereby first PMA assist layer 27a partially tilts the FGL 27b layer magnetization (magnetic moment) toward a perpendicular direction. Since second PMA assist layer 32 is separated from upper FGL 29 by a spacer 31, the magnetic influence of the former on FGL 29 in some cases may not be enough to partially tilt the upper FGL from its intrinsic in-plane magnetization direction. However, the present invention also anticipates that the magnetic coupling between second PMA assist layer 32 and FGL 29 may be sufficiently large to at least partially tilt the in-plane magnetization of the upper FGL to include a perpendicular component.

A capping layer 25 is formed on the second PMA assist layer 32 and is made of Ru/Ta/Ru, Ru/Ta, or other capping layer materials used in the art. Once all of the layers in the STO stack are formed, an annealing process may be performed at a temperature between 150° C. to 300° C., and preferably from 180° C. to 250° C. for a period of 0.5 to 5 hours.

Figure 5:
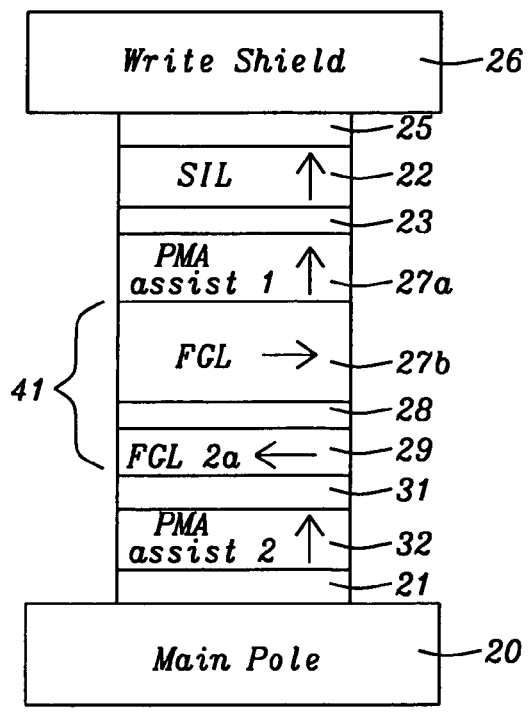
FIG. 5 is a cross-sectional view of a top STO structure having a first PMA assist layer adjoining a top surface of a synthetic FGL, and a stack comprised of a second PMA assist layer and a spacer formed between a seed layer and a bottom surface of the synthetic FGL according to a second embodiment of the present invention.

Referring to FIG. 5, a second embodiment of the present invention is shown that relates to a top STO structure wherein all of the layers in the first embodiment are retained except the deposition sequence is modified. In particular, the STO stack is represented by seed layer/second PMA assist layer/second spacer/SyAF FGL/first PMA assist layer/first spacer/SIL/capping layer wherein the SyAF FGL 41 is a composite with a lower FGL 29, upper FGL 27b, and a middle coupling layer 28. Note that the thinner FGL 29 contacts a top surface of the second spacer 31 and the thicker FGL 27b contacts the first PMA assist layer 27a. PMA assist layers 27a, 32 serve to tilt the magnetization of FGL 27b and FGL 29, respectively, toward a perpendicular to plane direction as in the first embodiment and thereby facilitate an oscillation state in FGL 41 at a lower current density than previously realized with a single PMA assist layer.

Figure 6:
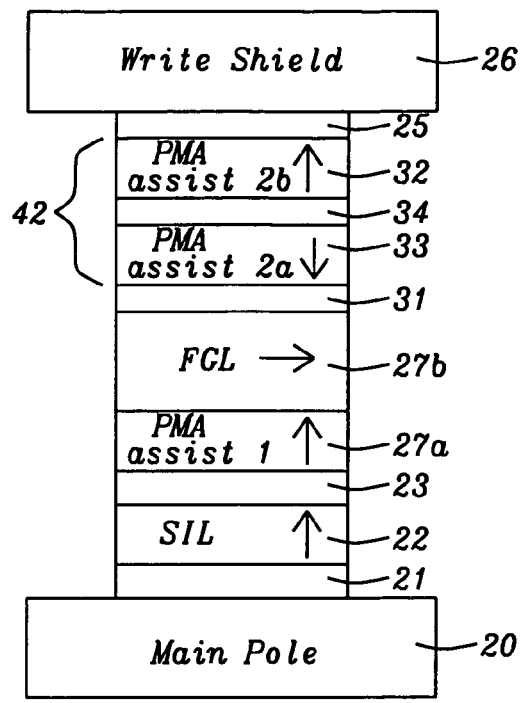
FIG. 6 is a cross-sectional view of a bottom STO structure having a first PMA assist layer adjoining a bottom surface of a FGL, and with a spacer and a synthetic second PMA assist layer formed on a top surface of the FGL according to a third embodiment of the present invention.

Referring to FIG. 6, a third embodiment of the present invention is depicted and represents a modification of the first embodiment. In particular, the SyAF FGL 40 is replaced by a single FGL 27b having a thickness from 100 to 200 Angstroms, and the second PMA assist layer 32 is replaced by a synthetic PMA structure 42 comprised of a lower PMA layer 33 that contacts a second spacer 31, an upper PMA layer 32 with a magnetic moment in an opposite direction to that of the lower PMA layer and contacting a bottom surface of the capping layer 25, and a coupling layer 34 formed between PMA layers 32, 33. In this case, opposing magnetization directions in PMA layers 32, 33 is achieved by anti-ferromagnetic coupling through coupling layer 34 and not because PMA layer 33 has an intrinsic negative Hk value. The coupling layer 34 may be one of Ru, Ir, or Rh. PMA layer 33 has a (CoFe/Ni)q, (Co/Ni)q, (CoFe/NiFe)q, (CoFe/NiCo)q, (Co/NiFe)q, or (Co/NiCo)q composition where q is a lamination number between 3 and 6. PMA layer 32 has a composition described previously with a lamination number that is preferably between 7 and 10 such that p>q. Alternatively, PMA layer 32 may be a (Co/Pt)s or (Co/Pd)s laminated structure where s is an integer greater than 1. Therefore, upper PMA layer 32 has a thickness greater than first PMA layer 33. In the exemplary embodiment, a seed layer 21, SIL 22, first spacer 23, first PMA assist layer 27a, FGL 27b, second spacer 32, composite second PMA assist layer 42, and capping layer 25 are sequentially formed on a substrate that is a main pole 20. It is believed that both of first PMA assist layer 27a and PMA layer 33 (depending on spacer 31 thickness) may exert an assist effect on FGL 27b by partially tilting the magnetization of the FGL toward a perpendicular to plane direction. PMA layer 32 is employed here to assure the alignment of PMA layer 33.

Figure 7:
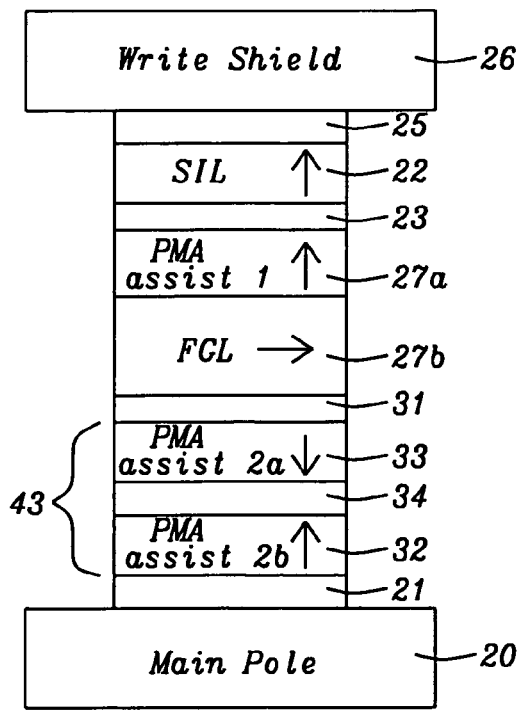
FIG. 7 is a cross-sectional view of a top STO structure having a first PMA assist layer adjoining a top surface of a FGL, and a stack comprised of a synthetic second PMA assist layer and a spacer formed between a seed layer and a bottom surface of the FGL according to a fourth embodiment of the present invention.

Referring to FIG. 7, a fourth embodiment of the present invention is shown that relates to a top STO structure where all of the layers in the third embodiment are retained except the deposition sequence is modified. In particular, the STO stack is formed by sequentially depositing seed layer 21, composite PMA assist layer 43, second spacer 31, FGL 27b, first PMA assist layer 27a, first spacer 23, SIL 22, and capping layer 25 on a substrate that is a main pole 20 in the exemplary embodiment. The composite second PMA assist layer 43 has a lower PMA layer 32 contacting a top surface of the seed layer, a middle coupling layer 34, and an upper PMA layer 33 contacting the second spacer 31. As in the third embodiment, PMA assist layers 27a, 33 serve to tilt the magnetization of FGL 27b toward a perpendicular to plane direction and thereby facilitate an oscillation state in FGL 27b at a lower current density than previously realized with a single PMA assist layer. PMA layer 32 is used only to assure the alignment of magnetization in PMA layer 33.

It should be understood that in all embodiments the FGL 27b functions as an oscillator layer by having a magnetic moment that is capable of switching from one direction along an easy axis (not shown) to an opposite direction when sufficient spin torque is applied by applying a current in a perpendicular to plane direction. SIL 22 is ferromagnetically coupled to field generation layer 27b. The Co content in a SIL laminate may be different than the Co content in PMA assist layer laminate without sacrificing any benefits provided by the STO embodiments of the present invention. Note that a laminated PMA assist layer does not require a separate seed layer to establish PMA and may have a crystal structure other than the (111) orientation in the laminated SIL 22.

According to the present invention, a method of forming a STO structure as defined herein also includes an annealing step after the capping layer 25 has been deposited. The annealing process comprises a temperature in the range of 150° C. to 300° C., and preferably between 180° C. and 250° C. for a period of 0.5 to 5 hours. Annealing may increase Hc by a significant amount. Thereafter, the STO structure may be patterned by a well known method involving conventional lithography and etching techniques to form a plurality of STO elements on a substrate (not shown).

EXAMPLE 1

A STO structure according to a first embodiment of the present invention was fabricated and has a configuration represented by the following: Ta10/Ru20/Cu20/(CoFe2/Ni6)n/Cu20/(CoFe2/Ni6)m/CoFe150/Ru8/FeCo30/Cu20/(CoFe2/Ni6)p/Ru10/Ta40/Ru30 where the number following each element or alloy is the thickness in Angstroms and p=5, m=10, and n=7. The seed layer has a Ta/Ru/Cu configuration and Ru/Ta/Ru is the capping layer. (CoFe/Ni)p is the second PMA assist layer, (CoFe/Ni)m is the first PMA assist layer, FeCo150 and FeCo30 are lower and upper portions, respectively, of a SyAF FGL, and (CoFe/Ni)n is the SIL.

EXAMPLE 2

A STO structure according to a second embodiment of the present invention was fabricated with a configuration represented by the following: Ta10/Ru20/Cu20/(CoFe2/Ni6)p/Cu20/CoFe30/Ru8/FeCo150/(CoFe2/Ni6)m/Cu20/(CoFe/Ni)n/Ru10/Ta40/Ru30 where the number following each element or alloy is the thickness in Angstroms and p=10, m=7, and n=15. The seed layer has a Ta/Ru/Cu configuration and Ru/Ta/Ru is the capping layer. (CoFe/Ni)p is the second PMA assist layer, (CoFe/Ni)m is the first PMA assist layer, FeCo150 and FeCo30 are upper and lower portions, respectively, of a SyAF FGL, and (CoFe/Ni)n is the SIL.

EXAMPLE 3

A STO structure according to a third embodiment of the present invention was fabricated with a configuration represented by the following: Ta10/Ru20/Cu20/(CoFe2/Ni6)n/Cu20/(CoFe2/Ni6)m/FeCo150/Cu20/(CoFe2/Ni6)q/Ru8/(CoFe/Ni)p/Ru10/Ta40/Ru30 where the number following each element or alloy is the thickness in Angstroms and p=10, q=5, m=10, and n=15. The seed layer has a Ta/Ru/Cu configuration while (CoFe/Ni)p and (CoFe/Ni)q are the upper and lower laminated portions, respectively, of a synthetic second PMA assist layer, (CoFe/Ni)m is the first PMA assist layer, FeCo is the FGL, (CoFe/Ni)n is the SIL, and Ru/Ta/Ru is the capping layer.

EXAMPLE 4

A STO structure according to a fourth embodiment of the present invention was built and has a configuration represented by the following: Ta10/Ru20/Cu20/(CoFe2/Ni6)p/Ru8/(CoFe2/Ni6)q/Cu20/CoFe150/(CoFe2Ni6)m/Cu20/(CoFe2/Ni6)n/Ru10/Ta40/Ru30 where the number following each element or alloy is the thickness in Angstroms and p=10, q=5, m=10, and n=15. The seed layer has a Ta/Ru/Cu configuration while (CoFe/Ni)p and (CoFe/Ni)q are the lower and upper laminated portions, respectively, of a synthetic second PMA assist layer, (CoFe/Ni)m is the first PMA assist layer, FeCo is the FGL, (CoFe/Ni)n is the SIL, and Ru/Ta/Ru is the capping layer.

The present invention provides an advantage over prior art STO structures in that a PMA layer is formed adjacent to both upper and lower surfaces of a FGL to generate a larger assist effect in achieving FGL oscillations than in prior art structures where zero or one PMA assist layer is employed with a FGL. This means that a FGL having a larger in-plane magnetic moment may reach an oscillation state with the same current density previously used to establish oscillation in a FGL having a significantly lower Mst value. Moreover, the FGL will provide a higher flux (ac field) to assist the writing process in a MAMR application. Another benefit is that assuming a FGL has a fixed Mst composition, the present invention will be able to excite an oscillation at a lower current density (lower bias voltage) than in a prior art structure with 0 or 1 adjacent PMA assist layers. Lower current density leads to lower power usage and better reliability especially when the spacer is a metal oxide in a TMR scheme where the breakdown voltage can be easily exceeded in prior art STO structures with relatively high current density.

While this invention has been particularly shown and described with reference to, the preferred embodiment thereof, it will be understood by those skilled in the art that various changes in form and details may be made without departing from the spirit and scope of this invention.

We claim:

1. A spin transfer oscillator (STO) structure, comprising:
   (a) a seed layer formed on a substrate;
   (b) a spin injection layer (SIL) having perpendicular magnetic anisotropy (PMA);
   (c) a composite field generation layer (FGL) having a synthetic anti-ferromagnetic (SyAF) configuration wherein a first FGL layer with a first thickness and a second FGL layer with a second thickness that is less than the first thickness have magnetic moments in opposite in-plane directions and are separated by a coupling layer;
   (d) a first PMA assist layer that adjoins the first FGL layer and is separated from the SIL by a first spacer; and
   (e) a second PMA assist layer that is separated from the second FGL by a second spacer, and wherein all of the aforementioned layers including the seed layer, SIL, composite FGL, first and second PMA assist layers, and first and second spacers are formed in a stack on the substrate.

2. The STO structure of claim 1 wherein the seed layer has a Ta/Ru/Cu configuration in which the Ta layer has a thickness from about 5 to 50 Angstroms, the Ru layer has a thickness between about 5 to 100 Angstroms, and the Cu layer has a thickness from about 1 to 100 Angstroms.

3. The STO structure of claim 1 further comprised of a capping layer and wherein the seed layer, SIL, first spacer, first PMA assist layer, composite FGL, second spacer, second PMA assist layer, and capping layer are sequentially formed on the substrate.

4. The STO structure of claim 1 further comprised of a capping layer and wherein the seed layer, second PMA assist layer, second spacer, composite FGL, first PMA assist layer, first spacer, SIL, and capping layer are sequentially formed on the substrate.

5. The STO structure of claim 1 wherein the first and second spacers are comprised of Cu.

6. The STO structure of claim 1 wherein the first spacer is a metal oxide and the second spacer is comprised of Cu.

7. The STO structure of claim 1 wherein the composite FGL has a FeCo/Ru/FeCo configuration wherein the first and second FGL layers are comprised of FeCo, the first thickness is from about 100 to 200 Angstroms, and the second thickness is less than about 50 Angstroms.

8. The STO structure of claim 1 wherein the SIL is comprised of (Co/Ni)n, (CoFe/Ni)n, (Co/NiFe)n, (CoFe/NiCo)n, (Co/NiCo)n, (CoFe/NiFe)n, (CoFe/Pt)n, (CoFe/Pd)n, (CoFe/Ir)n, CoPt, FePt, CoPd, FePd, or TbFe(Co) where n is from about 5 to 50.

9. The STO structure of claim 1 wherein the first PMA assist layer is comprised of (Co/Ni)m, (CoFe/Ni)m, (Co/NiFe)m, (CoFe/NiCo)m, (Co/NiCo)m, (CoFe/NiFe)m where m is from about 5 to 30, and the second PMA assist layer is comprised of (Co/Ni)p, (CoFe/Ni)p, (Co/NiFe)p, (CoFe/NiCo)p, (Co/NiCo)p, (CoFe/NiFe)p where p is from about 7 to 10.

10. The STO structure of claim 3 further comprised of a write shield formed on a top surface of the capping layer and wherein the substrate is a main pole layer in a microwave assisted magnetic recording (MAMR) device.

11. A spin transfer oscillator (STO) structure, comprising:
    (a) a seed layer formed on a substrate;
    (b) a spin injection layer (SIL) having perpendicular magnetic anisotropy (PMA);
    (c) a field generation layer (FGL) having top and bottom surfaces and with a magnetic moment in an in-plane direction;
    (d) a first PMA assist layer that adjoins one of the top and bottom surfaces of the FGL layer and is separated from the SIL by a first spacer; and
    (e) a second PMA assist layer that is separated from the other of the top and bottom FGL surfaces by a second spacer, said second PMA assist layer has a synthetic structure comprised of a first PMA layer with a first thickness, a second PMA layer with a second thickness less than the first thickness, and a coupling layer formed between the first and second PMA layers wherein all of the aforementioned layers including the seed layer, SIL, FGL, first and second PMA assist layers, and first and second spacers are formed in a stack on the substrate.

12. The STO structure of claim 11 wherein the seed layer has a Ta/Ru/Cu configuration in which the Ta layer has a thickness from about 5 to 50 Angstroms, the Ru layer has a thickness between about 5 to 100 Angstroms, and the Cu layer has a thickness from about 1 to 100 Angstroms.

13. The STO structure of claim 11 further comprised of a capping layer and wherein the seed layer, SIL, first spacer, first PMA assist layer, FGL, second spacer, second PMA assist layer, and capping layer are sequentially formed on the substrate.

14. The STO structure of claim 11 further comprised of a capping layer and wherein the seed layer, second PMA assist layer, second spacer, FGL, first PMA assist layer, first spacer, SIL, and capping layer are sequentially formed on the substrate.

15. The STO structure of claim 11 wherein the first and second spacers are comprised of Cu.

16. The STO structure of claim 11 wherein the first spacer is a metal oxide and the second spacer is comprised of Cu.

17. The STO structure of claim 11 wherein the FGL is FeCo or an alloy thereof with a thickness from about 100 to 200 Angstroms.

18. The STO structure of claim 11 wherein the SIL is a comprised of (Co/Ni)n, (CoFe/Ni)n, (Co/NiFe)n, (CoFe/NiCo)n, (Co/NiCo)n, (CoFe/NiFe)n, (CoFe/Pt)n, (CoFe/Pd)n, (CoFe/Ir)n, CoPt, FePt, CoPd, FePd, or TbFe(Co) where n is from about 5 to 50.

19. The STO structure of claim 11 wherein the first PMA assist layer is a laminate comprised of (Co/Ni)m, (CoFe/Ni)m, (Co/NiFe)m, (CoFe/NiCo)m, (Co/NiCo)m, (CoFe/NiFe)m where m is from about 5 to 30.

20. The STO structure of claim 11 wherein the first PMA layer with a first thickness is a laminate comprised of (Co/Ni)p, (CoFe/Ni)p, (Co/NiFe)p, (CoFe/NiCo)p, (Co/NiCo)p, (CoFe/NiFe)p where p is from about 7 to 10, and the second PMA layer with a second thickness is a laminate comprised of (Co/Ni)q, (CoFe/Ni)q, (Co/NiFe)q, (CoFe/NiCo)q, (Co/NiCo)q, (CoFe/NiFe)q where q is from about 3 to 6.

21. The STO structure of claim 13 further comprised of a write shield formed on a top surface of the capping layer and wherein the substrate is a main pole layer in a microwave assisted magnetic recording (MAMR) device.

22. A method of forming a STO structure, comprising:
    (a) depositing a composite seed layer on a substrate, said composite seed layer has a Ta/M1 or Ta/M1/M2 configuration wherein the M1 layer is a metal with a fcc(111) or hcp(001) crystal orientation, and M2 is a metal unequal to M1;

(b) forming a stack of layers on the composite seed layer, comprising:
  (1) a spin injection layer (SIL) having perpendicular magnetic anisotropy (PMA);
  (2) a composite field generation layer (FGL) having a synthetic anti-ferromagnetic (SyAF) configuration wherein a first FGL layer with a first thickness and a second FGL layer with a second thickness that is less than the first thickness have magnetic moments in opposite in-plane directions and are separated by a coupling layer;
  (3) a first PMA assist layer that adjoins a surface of the first FGL layer and is separated from the SIL by a first spacer;
  (4) a second PMA assist layer that is separated from the second FGL by a second spacer; and
  (5) a capping layer; and
(c) annealing said seed layer, capping layer, and said stack of layers.

23. The method of claim 22 wherein the annealing comprises a temperature between about 150° C. and 300° C. for a period of about 0.5 to 5 hours.

24. The method of claim 22 wherein the SIL, first spacer, first PMA assist layer, composite FGL, second spacer, second PMA assist layer, and capping layer are sequentially formed on the seed layer, the substrate is a main pole, and a write shield is subsequently formed on the capping layer.

25. The method of claim 22 wherein the second PMA assist layer, second spacer, composite FGL, first PMA assist layer, first spacer, SIL, and capping layer are sequentially formed on the seed layer, the substrate is a main pole, and a write shield is subsequently formed on the capping layer.

26. A method of forming a STO structure, comprising:
  (a) depositing a composite seed layer on a substrate, said composite seed layer has a Ta/M1 or Ta/M1/M2 configuration wherein the M1 layer is a metal with a fcc(111) or hcp(001) crystal orientation, and M2 is a metal unequal to M1;
  (b) forming a stack of layers on the composite seed layer, comprising:
    (1) a spin injection layer (SIL) having perpendicular magnetic anisotropy (PMA);
    (2) a field generation layer (FGL) with a magnetic moment in an in-plane direction, and having top and bottom surfaces;
    (3) a first PMA assist layer that adjoins one of the top and bottom surfaces of the FGL and is separated from the SIL by a first spacer;
    (4) a second PMA assist layer that is separated from the other of the top and bottom FGL surfaces by a second spacer, said second PMA assist layer has a synthetic structure comprised of a first PMA layer with a first thickness, a second PMA layer with a second thickness less than the first thickness, and a coupling layer formed between the first and second PMA layers; and
    (5) a capping layer; and
  (c) annealing said seed layer, capping layer, and said stack of layers.

27. The method of claim 26 wherein the annealing comprises a temperature between about 150° C. and 300° C. for a period of about 0.5 to 5 hours.

28. The method of claim 26 wherein the SIL, first spacer, first PMA assist layer, FGL, second spacer, second PMA assist layer, and capping are sequentially formed on the seed layer, the substrate is a main pole, and a write shield is subsequently formed on the capping layer.

29. The method of claim 26 wherein the second PMA assist layer, second spacer, FGL, first PMA assist layer, first spacer, SIL, and capping layer are sequentially formed on the seed layer, the substrate is a main pole, and a write shield is subsequently formed on the capping layer.

* * * * *